United States Patent
Vashohenko et al.

(10) Patent No.: US 6,998,651 B1
(45) Date of Patent: Feb. 14, 2006

(54) LVTSCR-LIKE STRUCTURE WITH BLOCKING JUNCTION UNDER THE POLYGATE

(75) Inventors: Vladislav Vashohenko, Palo Alto, CA (US); Ann Concannon, San Jose, CA (US); Peter J. Hopper, San Jose, CA (US); Marcel Eer Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/389,069

(22) Filed: Mar. 14, 2003

(51) Int. Cl.
*H01L 29/74* (2006.01)
*H01L 31/111* (2006.01)

(52) U.S. Cl. .................. 257/133; 257/162; 257/355
(58) Field of Classification Search ............... 257/119, 257/122, 124, 133, 140, 141, 142, 146, 162, 257/355, 356, 357, 107, 177, 132, 362–365, 257/173, 174; 438/135, 133
See application file for complete search history.

(56) References Cited

U.S. PATENT DOCUMENTS

| | | | | |
|---|---|---|---|---|
| 5,240,865 A | * | 8/1993 | Malhi | 438/135 |
| 6,750,515 B1 | * | 6/2004 | Ker et al. | 257/357 |

* cited by examiner

*Primary Examiner*—B. William Baumeister
*Assistant Examiner*—Dana Farahani
(74) *Attorney, Agent, or Firm*—Jurgen Vollrath

(57) ABSTRACT

In a LVTSCR-like structure, an additional p+ region is formed adjacent a n+ floating drain to define a p-n junction with the floating drain underneath a polygate of the structure. The polygate is used as a mask during doping of the p+ region and the n+ floating drain, and the length of the polygate is adjusted to provide the desired triggering voltage for the structure. The triggering voltage is also adjusted by biasing the polygate.

14 Claims, 1 Drawing Sheet

LVTSCR-LIKE STRUCTURE WITH BLOCKING JUNCTION UNDER THE POLYGATE

BACKGROUND OF THE INVENTION

The LVTSCR, originally developed by Texas Instruments, has found widespread application as a control device, especially in electrostatic discharge (ESD) protection. A cross-section through a typical LVTSCR is shown in FIG. 1, which shows a p+ well contact 102, source 104, polygate 106, floating n+ drain 108, p+ drain 110, and n+ drain contact 112. To avoid the two n– regions 108, 112 simply acting as drains of a NMOS transistor, the p+ drain 110 is isolated from the p-substrate 120 by a n-well 122, the structure being controlled by the primary snapback of the NMOS structure which is dictated by the breakdown voltage that is determined by the electric field under the polygate 106.

The problem with the LVTSCR 100 is that it has a rather high breakdown voltage, thus having a high triggering voltage. Also, a cascaded structure is typically required when using a LVTSCR as overvoltage clamp where the voltage typically exceeds the maximum gate voltage.

The present invention addresses the above shortcomings of the LVTSCR structure of FIG. 1.

SUMMARY OF THE INVENTION

The invention relates to a new LVTSCR structure, which will also be referred to as a LVTSCR-like structure to distinguish it from the LVTSCR structure known in the art.

According to the invention, there is provided a method of forming a LVTSCR-like structure with improved parameters over a conventional LVTSCR, the LVTSCR-like structure defining an anode and a cathode and having a polygate, the method comprising forming an additional p+ region in the cathode to define a p-n junction with a n+ floating drain. Preferably the p-n junction is formed to lie beneath the polygate of the structure, and the polygate may be used as a mask during doping of the p+ region and the n+ floating drain. Typically, the p+ region is formed in a PLDD region and the n+ floating drain is formed in a NLDD region. A p-well/n-well junction may be formed underneath the polygate, with the p+ region formed in the p-well, and the n+ floating drain formed in the n-well.

The polygate may be biased by connecting it to the anode or the cathode or to a separate biasing circuit. As a further aspect of the invention, the p+ region and n+ floating drain may be formed during a high voltage portion of a CMOS process and the polygate during a low voltage portion. In fact any one or more of the n+ floating drain, p+ region, NLDD, PLDD, n-well, or p-well may be formed during a high voltage portion of the process and the remaining regions during a low voltage portion, or vice versa. Triggering voltage of the structure may be controlled by adjusting the polygate length or by adjusting the bias of the polygate e.g., to about half the anode voltage.

Further, according to the invention, there is provided a method of forming a LVTSCR structure with improved parameters over a conventional LVTSCR, the LVTSCR structure defining an anode and a cathode, and having a polygate, comprising forming a n+/p+ junction beneath the polygate. Typically, the n+/p+ junction is formed by forming an additional p+ region adjacent a n+ floating drain of the LVTSCR structure, and the polygate may be used as a mask when forming the p+ region and n+ floating drain. In addition, a p-well/n-well junction may be formed underneath the polygate.

The distance between the p+ region and the n+ floating drain may be adjusted to vary the triggering voltage of the LVTSCR structure. Also, the polygate may be biased by connecting it to the anode or the cathode or to a separate biasing circuit. According to one aspect of the invention, the method may comprise forming the p+ region and n+ floating drain during a high voltage portion of a CMOS process and the polygate during a low voltage portion of the process.

An important feature of the invention is that it allows adjusting the polygate length to adjust the triggering voltage of the LVTSCR structure. In one application, the polygate may be biased to about half the anode voltage.

Still further, according to the invention, there is provided a LVTSCR structure that includes a n+ floating drain and a polygate, as well as an additional p+ region formed adjacent the n+ floating drain, so as to define a p/n junction with the n+ floating drain underneath the polygate. The n+ floating drain and additional p+ region are typically formed in a NLDD and a PLDD region, respectively, and the NLDD and PLDD regions may be formed in a n-well and a p-well, respectively, the n-well/p-well junction lying beneath the polygate. The polygate may, in addition, be connected to a cathode or an anode of the structure or to a separate bias circuit.

DETAILED DESCRIPTION OF THE INVENTION

Figure 1:
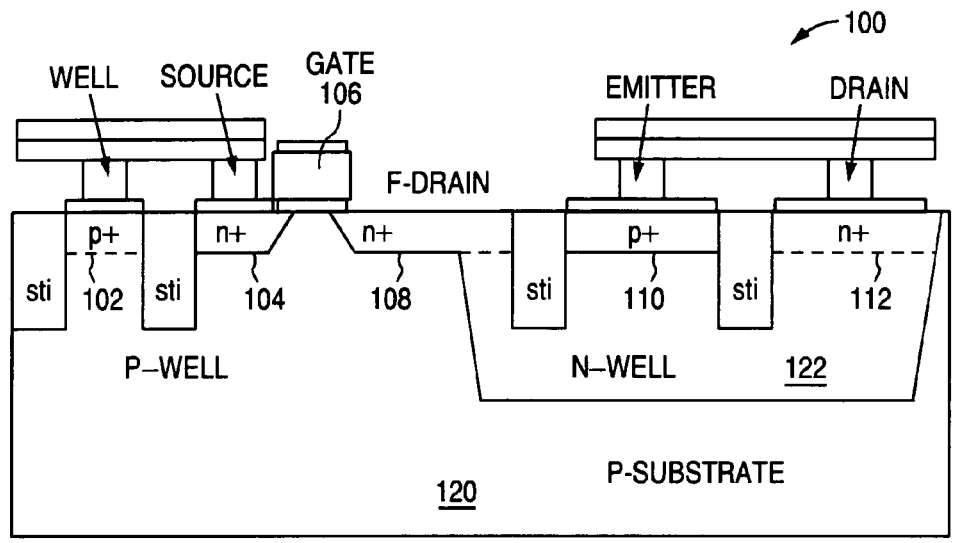
FIG. 1 shows a cross section through a typical prior art LVTSCR.
Figure 2:
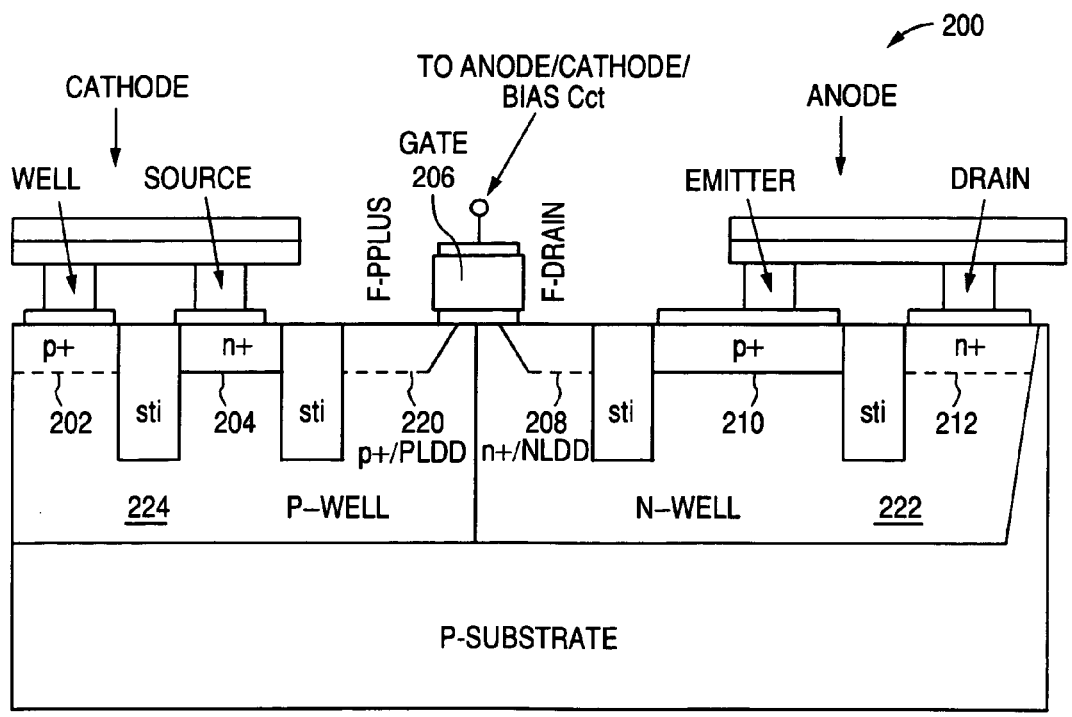
FIG. 2 shows a cross section through one embodiment of a LVTSCR-like structure of the invention.

FIG. 2 shows one embodiment of a LVTSCR structure of the invention. The structure 200 includes a p+ well contact 202, source 204, polygate 206, floating n+ drain 208, p+ drain 210, and n+ drain contact 212. In addition, the structure 200 includes a new floating p+ region 220 in the cathode to define a blocking junction under the polygate 206 between the floating n+ drain 208 and the new p+ region 220.

The present invention makes use of the polygate 206 to serve as a mask during doping of the n+ drain 208 and new p+ region 220. This takes account of misalignment between doping masks during doping since the doping masks can overlap the polygate 206 without effecting the spacing between the doping regions. The polygate thus, in effect, acts as a self-aligned mask. This allows an abrupt p-n junction to be created and results in a breakdown voltage that can be adjusted by adjusting the polygate 206 length. Thus the breakdown voltage can be reduced by simply reducing the gate length. In practice, using standard CMOS process steps, the highly doped n+ drain 208 and p+ region 220 are typically formed in lightly doped regions referred to as n-lightly doped drain (NLDD) and p-lightly doped drain (PLDD), respectively (not shown). Thus the new p-n junction is, in effect, a junction between NLDD and PLDD of the n+/NLDD and p+/PLDD combinations. It will, however, be appreciated that the present invention could be implemented with one or both LDD regions blocked out, thereby defining a blocking junction between NLDD and p+, or between PLDD and n+, or between p+ and n+, as the case may be. In one embodiment, the doping of the n+ drain 208 and p+ region 220 is performed during a high voltage phase of the process. A typical semiconductor circuit may include a core and an I/O structure. These two portions typically operate at different voltages. The core typically operates at a lower voltage dictated by the process, e.g. for a 0.18 µm process the voltage is 1.8V±10%, while the I/O structure may operate at a higher voltage of 3.3V or 5V. For a 0.251 µm process the core voltage is 2.5V±10%, while the I/O voltage will again be at a higher voltage of 3.3V or 5V. These different portions will be implemented by varying the process steps in order to accommodate the low and high voltage levels, respectively. For instance, in the case of a high voltage structure, the gate oxide has to be thicker and is typically implemented by making use of a dual or triple oxide. For example in the case of a 0.18 µm process, the gate for the low voltage part has a length of 0.18 µm and a gate oxide thickness (for the oxide layer underneath the gate) of 30 Å, while the gate for the high voltage part has a length of approximately 0.35–0.4 µm and a gate oxide thickness of 70 Å. Also, the doped regions will be adapted to the different operating voltage. During a high voltage process, more dopant extends under the gate from either side of the gate 230. Thus, for example in a 0.18 µm process, a junction width between the p+ and n+ regions 210, 220 of approximately 0.15 µm is achieved even with a polygate length of 0.35 µm. In contrast, for a low voltage implantation in a 0.18 µm process the junction width will remain rather large (approximately 0.1 um) even with a polygate length of only 0.18 µm.

The present invention proposes making use of a combination of high and low voltage process steps for a single device. For example, by making use of high voltage process steps in forming the n+ drain 208 and p+ region 220, while forming the gate using low voltage process steps a shorter gap length to be achieved under the polygate, between the n+ drain 208 and p+ region 220. Results indicate that a negative gap length, i.e., overlap, can be achieved. This results in very low breakdown voltages of the order of about 3V for a 0.18 µm process. As the length of the polygate 206 is increased, the junction between the doping regions smoothes out and the breakdown voltage increases. Thus breakdown voltage can be carefully controlled by adjusting the polygate length. Simulation results show that the breakdown can be increased in this way up to the well—well breakdown voltage level.

While the embodiments discussed above dealt with high voltage regions for the n+ and p+ regions, it will be appreciated that the formation of the NLDD and PLDD could also involve different voltages process steps to that used for the polygate. A CMOS process could also combine two different voltage levels for different doped regions, e.g., 1.8 V and 3.3 V CMOS process to provide different combinations of high and low voltage LDD's and n+ and p+ regions and even different combinations of high and low voltage n-well 222 and p-well 224. For example a high voltage process may be used to form the p-well 224, and a low voltage process to form the n-well 222.

As can be seen from FIG. 2, the junction between the n-well 222 and the p-well 224 is also shifted in this embodiment to lie below the polygate 206.

The invention further includes adjusting the breakdown voltage by biasing the polygate 206. This can be done by connecting the gate 206 to the anode or cathode of the LVTSCR structure (either directly or through a resistor) or by biasing the gate 206 using a separate bias circuit. (It will be appreciated that the anode of the structure in FIG. 2 is defined by the drain/emitter side while the cathode is defined by the well/source side.

This biasing of the gate 206 facilitates an important application of the new LVTSCR structure, namely for use as an overvoltage cell without the need to use a cascoded structure. For example, if a 5V tolerant cell with 4V gate oxide is realized, the gate potential can be provided at about 2.5V through the use of a divider circuit. In contrast to single gate NMOS devices this new structure will ensure low leakage operation. Also, the self-aligning effect realized by the polygate will ensure stable parameters. Also, the structure provides for gate dynamic control during ESD pulses.

It will be appreciated that although the invention was described with respect to a specific embodiment, it can be implemented in different ways, defining a p-n junction under the polygate, without departing from the scope of the invention as defined by the claims.

What is claimed is:

1. A method of forming a LVTSCR structure snapback structure, comprising forming an LVTSCR, which includes a polygate with an n-well formed on one side of the gate and a p-well formed on the other side of the gate, a p+ region and an n+ source formed in the p-well to define a cathode, a p+ emitter and an n+ drain formed in the n-well to define an anode, and an n+ floating drain formed on the n-well side of the gate, the method further comprising forming an additional p+ region in the cathode to define a p-n junction with the n+ floating drain.

2. A method of claim 1, wherein the p-n junction is formed to lie underneath the polygate of the structure.

3. A method of claim 2, further comprising using the polygate as a mask during doping of the p+ region and the n+ floating drain.

4. A method of claim 3, wherein the p+ region is formed in a PLDD region and the n+ floating drain is formed in a NLDD region.

5. A method of claim 3, wherein at least one of the additional p+ region and n+ floating drain is formed in a corresponding LDD region.

6. A method of claim 4, wherein the polygate is also used as a mask during formation of the PLDD and NLDD regions.

7. A method of claim 5, further comprising forming a p-well/n-well junction underneath the polygate.

8. A method of claim 2, further comprising biasing the polygate.

9. A method of claim 8, wherein the polygate is biased by connecting it to the anode or the cathode or to a separate biasing circuit.

10. A method of claim 8, further comprising forming the p+ region and n+ floating drain during a high voltage portion of a CMOS process and the polygate during a low voltage portion of the process.

11. A method of claim 7, wherein at least one of the additional p+ region, n+ floating drain, PLDD, NLDD, p-well, and n-well is formed by a high voltage process and any remaining regions are formed by a low voltage process, or vice versa.

12. A method of claim 6, further comprising adjusting the polygate length to adjust the triggering voltage of the LVTSCR structure.

13. A method of claim 11, further comprising adjusting the polygate length to adjust the triggering voltage of the LVTSCR structure.

14. A method of claim 8, wherein the polygate is biased to about half the anode voltage.

* * * * *

UNITED STATES PATENT AND TRADEMARK OFFICE
CERTIFICATE OF CORRECTION

| | | |
|---|---|---|
| PATENT NO. | : 6,998,651 B1 | |
| APPLICATION NO. | : 10/389069 | |
| DATED | : February 14, 2006 | |
| INVENTOR(S) | : Vladislav Vashchenko et al. | |

It is certified that error appears in the above-identified patent and that said Letters Patent is hereby corrected as shown below:

On the cover page of the patent, at (75) Inventors: Remove "Vladislav Vashohenko" and insert -- Vladislav Vashchenko --, and remove "Marcel Eer Beek" and insert -- Marcel ter Beek --.

Signed and Sealed this

Eighteenth Day of January, 2011

David J. Kappos
*Director of the United States Patent and Trademark Office*